(12) United States Patent
Cobbley et al.

(10) Patent No.: US 6,965,160 B2
(45) Date of Patent: Nov. 15, 2005

(54) SEMICONDUCTOR DICE PACKAGES EMPLOYING AT LEAST ONE REDISTRIBUTION LAYER

(75) Inventors: Chad A. Cobbley, Boise, ID (US); Jerry M. Brooks, Caldwell, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 10/219,604

(22) Filed: Aug. 15, 2002

(65) Prior Publication Data

US 2004/0032013 A1 Feb. 19, 2004

(51) Int. Cl.[7] ............................................. H01L 23/02
(52) U.S. Cl. .................. 257/686; 257/698; 257/685; 257/723; 257/738; 257/724
(58) Field of Search .............................. 257/686, 777, 257/685, 723, 786, 784, 737, 738, 724, 684, 691, 698

(56) References Cited

U.S. PATENT DOCUMENTS

| | | | |
|---|---|---|---|
| 4,772,936 A | 9/1988 | Reding et al. | |
| 4,862,322 A | 8/1989 | Bickford et al. | |
| 4,948,754 A | 8/1990 | Kondo et al. | |

(Continued)

FOREIGN PATENT DOCUMENTS

| | | |
|---|---|---|
| EP | 0486629 A2 | 5/1992 |
| EP | 0692823 A1 | 7/1994 |
| EP | 0622847 A2 | 11/1994 |
| EP | 0660405 A2 | 11/1994 |
| EP | 0684644 A1 | 11/1995 |
| EP | 0704900 A2 | 9/1996 |
| JP | 57085244 A2 | 5/1982 |
| JP | 59229850 | 12/1984 |
| JP | 1023546 A2 | 1/1989 |
| JP | 1061934 A | 3/1989 |
| JP | 1132150 A2 | 5/1989 |
| JP | 5036857 A2 | 2/1993 |
| JP | 05129366 | 5/1993 |
| JP | 6-077293 | 6/1993 |
| JP | 05275578 | 10/1993 |
| JP | 08330355 A | 12/1996 |
| WO | WO 97/373740 | 10/1997 |

OTHER PUBLICATIONS

One page copy of two overhead projections shown at a Semiconductor Industry Conference in San Diego, CA, "Activity Report of CSP Study Group" and "Chip Size Package," JWG#2–8, Jun. 1995.

Letter from Avi Ben–Har to Warren Farnworth, dated Mar. 27, 1996 (1 page), transmitting a copy of Zilber, G., et al., *Slimcase–A Thin Chip Size, Integrated Circuit Package* (8 pages), to have been presented at ISHM–MCM Conference, Denver, CO Apr. 18, 1996.

*Primary Examiner*—Nathan J. Flynn
*Assistant Examiner*—Victor A. Mandala, Jr.
(74) *Attorney, Agent, or Firm*—TraskBritt

(57) ABSTRACT

A method and apparatus for assembling and packaging semiconductor dice. The semiconductor dice or assemblies of stacked and electrically interconnected semiconductor dice are placed at mutually spaced locations with respect to a common plane and encapsulated in a dielectric material so that end portions of discrete conductive elements extending outwardly from each semiconductor die adjacent the common plane are exposed through an outer surface of the dielectric material. Redistribution lines are formed to extend from the exposed end portions of the discrete conductive elements to predetermined locations over the outer surface of the encapsulant which correspond with another interconnect outline, such as terminal pads of a printed circuit board, and conductive bumps formed at the predetermined locations. Encapsulated semiconductor dice or die stacks may be severed from the encapsulant to form individual packages, or laterally spaced semiconductor dice electrically interconnected by redistribution lines may be maintained together as a group in a single package or module.

44 Claims, 7 Drawing Sheets

U.S. PATENT DOCUMENTS

| | | |
|---|---|---|
| 4,998,159 A | 3/1991 | Shinohara et al. |
| 5,082,802 A | 1/1992 | Gelsomini |
| 5,138,434 A | 8/1992 | Wood et al. |
| 5,147,815 A | 9/1992 | Casto |
| 5,168,345 A | 12/1992 | Brossart |
| 5,216,278 A | 6/1993 | Lin et al. |
| 5,239,198 A | 8/1993 | Lin et al. |
| 5,246,880 A | 9/1993 | Reele et al. |
| 5,281,151 A | 1/1994 | Arima et al. |
| 5,289,346 A | 2/1994 | Carey et al. |
| 5,291,062 A | 3/1994 | Higgins, III |
| 5,311,057 A | 5/1994 | McShane |
| 5,327,008 A | 7/1994 | Djennas et al. |
| 5,327,013 A | 7/1994 | Moore et al. |
| 5,334,857 A | 8/1994 | Mennitt et al. |
| 5,355,283 A | 10/1994 | Marrs et al. |
| 5,365,409 A | 11/1994 | Kwon et al. |
| 5,376,825 A | 12/1994 | Tukamoto et al. |
| 5,379,191 A | 1/1995 | Carey et al. |
| 5,384,487 A | 1/1995 | Rostoker et al. |
| 5,386,341 A | 1/1995 | Olsen et al. |
| 5,399,903 A | 3/1995 | Rostoker et al. |
| 5,422,163 A | 6/1995 | Kamiyama et al. |
| 5,424,492 A | 6/1995 | Petty et al. |
| 5,438,224 A | 8/1995 | Papageorge et al. |
| 5,440,171 A | 8/1995 | Miyano et al. |
| 5,454,160 A | 10/1995 | Nickel |
| 5,483,101 A | 1/1996 | Shimoto et al. |
| 5,490,040 A | 2/1996 | Gaudenzi et al. |
| 5,490,324 A | 2/1996 | Newman |
| 5,497,397 A | 3/1996 | Hershey et al. |
| 5,498,767 A | 3/1996 | Huddleston et al. |
| 5,502,289 A | 3/1996 | Takiar et al. |
| 5,506,756 A | 4/1996 | Haley |
| 5,521,435 A | 5/1996 | Mizukoshi |
| 5,523,622 A | 6/1996 | Harada et al. |
| 5,593,927 A | 1/1997 | Farnworth et al. |
| 5,604,379 A | 2/1997 | Mori |
| 5,643,830 A | 7/1997 | Rostoker et al. |
| 5,646,828 A | 7/1997 | Degani et al. |
| 5,677,576 A | 10/1997 | Akagawa |
| 5,683,942 A | 11/1997 | Kata et al. |
| 5,710,071 A | 1/1998 | Beddingfield et al. |
| 5,715,144 A | 2/1998 | Ameen et al. |
| 5,726,489 A | 3/1998 | Matsuda et al. |
| 5,736,456 A | 4/1998 | Akram |
| 5,741,729 A | 4/1998 | Selna |
| 5,759,047 A | 6/1998 | Brodsky et al. |
| 5,817,986 A | 10/1998 | Davidson et al. |
| 5,844,304 A | 12/1998 | Kata et al. |
| 5,851,911 A | 12/1998 | Farnworth |
| 5,973,389 A | 10/1999 | Culnane et al. |
| 5,984,691 A | 11/1999 | Brodsky et al. |
| 5,992,012 A | 11/1999 | Kirkman |
| 5,994,766 A | 11/1999 | Shenoy et al. |
| 6,025,647 A | 2/2000 | Shenoy et al. |
| 6,048,753 A | 4/2000 | Farnworth et al. |
| 6,133,626 A | 10/2000 | Hawke et al. |
| 6,147,413 A | 11/2000 | Farnworth |
| 6,165,815 A | 12/2000 | Ball |
| 6,166,444 A | 12/2000 | Hsuan et al. |
| 6,169,329 B1 | 1/2001 | Farnworth et al. |
| 6,181,010 B1 | 1/2001 | Nozawa |
| 6,198,169 B1 | 3/2001 | Kobayashi et al. |
| 6,204,559 B1 * | 3/2001 | Lin et al. ............... 257/738 |
| 6,232,666 B1 | 5/2001 | Corisis et al. |
| 6,242,815 B1 | 6/2001 | Hsu et al. |
| 6,255,671 B1 | 7/2001 | Bojarczuk, Jr. et al. |
| 6,278,177 B1 | 8/2001 | Ryu |
| 6,287,893 B1 | 9/2001 | Elenius et al. |
| 6,316,839 B1 | 11/2001 | Farnworth |
| 6,329,608 B1 | 12/2001 | Rinne et al. |
| 6,340,606 B1 | 1/2002 | Hashimoto |
| 6,426,562 B2 | 7/2002 | Farnworth |
| 2002/0105092 A1 * | 8/2002 | Coyle ............... 257/778 |
| 2002/0113324 A1 | 8/2002 | Cordes et al. |

* cited by examiner

SEMICONDUCTOR DICE PACKAGES EMPLOYING AT LEAST ONE REDISTRIBUTION LAYER

BACKGROUND OF THE INVENTION

1. Field of the Invention

The present invention relates generally to a method and apparatus for packaging of semiconductor dice. More particularly, the present invention relates to a method and apparatus of packaging one or more semiconductor dice and providing redistributed input/output locations therefor without the use of a supporting substrate.

2. State of the Art

Interconnection and packaging-related issues are among the factors that determine not only the number of circuits that can be integrated on a chip, but also the performance of the chip. These issues have gained in importance as advances in chip design have led to reduced sizes of transistors and enlarged chip dimensions. The industry has come to realize that merely having a fast chip will not necessarily result in a fast system; the fast chip must also be supported by equally fast and reliable electrical connections. Essentially, the electrical connections, in conjunction with the packaging, enable the chip to receive and send signals and supply the chip power and a reference voltage (such as ground or other fixed bias voltage), and redistribute the tightly packed terminals (bond pads) of the chip to match the more widely spaced terminals of a carrier substrate and then to a circuit board.

One example of an integrated circuit device is known as a "flip-chip." Flip-chip attachment generally includes electrically and mechanically attaching a semiconductor die by its active surface to an interposer substrate or other carrier substrate using a pattern of discrete conductive elements extending transversely therebetween. The discrete conductive elements are generally disposed on the active surface of the die during fabrication thereof, but may instead be disposed on the carrier substrate. The discrete conductive elements may comprise minute conductive bumps, balls, columns or pillars of various configurations. Each discrete conductive element is placed corresponding to mutually aligned locations of bond pads (or other, redistributed I/O locations) on the semiconductor die and terminals on the carrier substrate when the two components are superimposed. The semiconductor die is thus electrically and mechanically connected to the carrier substrate by, for example, reflowing conductive bumps of solder or curing conductive or conductor-filled epoxy bumps. A dielectric underfill may then be disposed between the die and the carrier substrate for environmental protection and to enhance the mechanical attachment of the die to the carrier substrate. For example, U.S. Pat. No. 5,710,071 to Beddingfield et al. discloses a fairly typical flip-chip attachment of a semiconductor die to a substrate and a method of underfilling a gap between the semiconductor die and substrate.

As new generations of integrated circuit products are released, the number of components used to fabricate them tends to decrease due to advances in technology even though the functionality of the products increases. Ongoing goals of the computer industry include higher performance, lower cost, increased miniaturization of components, and greater packaging density of integrated circuits in, for example, a flip-chip type assembly. However, flip-chip type assemblies including one or more bumped semiconductor dice and employing an interposer substrate between a bumped semiconductor die and a carrier substrate such as a circuit board may be undesirably thick due to the combined height of the die and interposer substrate. Such an interposer substrate may be utilized between the bumped semiconductor die or dice and circuit board to redistribute the large number of tightly packed terminals from the die to a standard interconnect outline on a circuit board. In an effort to limit the height of a flip-chip type assembly including a plurality of bumped semiconductor dice, the use of thin, flexible interposer substrates has been proposed. By way of example, U.S. Pat. No. 5,386,341 to Olson et al. discloses a thin, flexible substrate utilized as an interposer substrate between a plurality of bumped semiconductor dice and a circuit board. However, aligning each of the bumps on the semiconductor dice with the corresponding terminals on the interposer substrate is difficult and results in reliability issues. These reliability issues are only compounded with the increased miniaturization of components. Furthermore, interposer substrate technology has become highly sophisticated due to the increased miniaturization of components, which has increased the cost for such interposer substrates, in some instances, to approximately 30% of the total cost of the resulting assembly.

Therefore, it would be advantageous to provide a bumped semiconductor die assembly including one or more semiconductor dice which avoids the use of a conventional interposer substrate.

BRIEF SUMMARY OF THE INVENTION

The present invention relates to methods and apparatus for assembling and packaging one or more discrete semiconductor dice. The present invention provides a method and apparatus for redistributing the interconnections for one or more semiconductor dice to an interconnect outline of, for example, a printed circuit board or other higher-level packaging without utilizing an interposer substrate or other supporting substrate. The present invention also provides a method and apparatus for electrically interconnecting a plurality of separate semiconductor dice in a packaged semiconductor die array without utilizing a supporting substrate. As used herein, the term "array" means only that a plurality of semiconductor dice is assembled and packaged, and may not be taken as limiting to any particular arrangements or orientations.

The semiconductor die package of the present invention may be assembled by positioning multiple semiconductor dice mutually separate from each other and with respect to a common plane, optionally on a first flexible substrate including a dielectric layer. The semiconductor dice may be placed on the first flexible substrate at multiple die attach sites in rows and columns. The first flexible substrate may be of a rectangular shape, of a circular shape or of another suitable shape and may be formed from a polymer material, such as a polyimide laminate or polyimide tape. Other types of flexible dielectric materials may also be utilized.

The semiconductor dice attached to the flexible substrate or otherwise fixed in position may each include an active surface and a back surface, wherein the active surface includes a plurality of discrete conductive elements extending outward therefrom to the common plane. The semiconductor dice may be adhesively attached to the flexible substrate or, for example, directly to a common plane provided by an interior surface of a mold cavity so that each semiconductor die is attached facedown to the flexible substrate or mold cavity surface with the discrete conductive elements extending therebetween.

Dielectric filler material may then be introduced to underfill each die of the mutually separate semiconductor dice and to encapsulate the sides and backs of the semiconductor dice. Optionally, a second flexible substrate, similar to the size of the underlying flexible substrate, may then be adhesively attached to the back surface of the mutually separate semiconductor dice and an encapsulant introduced between the two flexible substrates. In either case, the dielectric filler material formed under and around each of the mutually separate semiconductor dice provides an array of encapsulated and laterally separated semiconductor dice. Methods utilized for providing the dielectric filler material may include various dispensing methods, including transfer molding, injection molding and pot molding techniques.

The first flexible substrate, if used, may then be stripped from the array of encapsulated semiconductor dice to expose an outer surface of the dielectric filler material. Such removal also exposes end portions of the discrete conductive elements extending from each of the mutually separate semiconductor dice. With this arrangement, the exposed end portions of the discrete conductive elements are substantially flush with the outer surface of the filler material. The second flexible substrate may be removed or remain on the upper surface of the array for protection thereof.

With the end portions of the discrete conductive elements exposed flush with the outer surface of the dielectric filler material, redistribution lines may be formed on the outer surface of the dielectric filler material by depositing a redistribution layer precursor and then patterning such redistribution layer precursor to define redistribution lines comprising circuit traces in communication with the discrete conductive elements and extending to other locations. The redistribution lines may also be preformed in patterns to correspond with locations of the exposed end portions of the discrete conductive elements and then attached to the outer surface of the dielectric material in contact with the exposed end portions. Conductive bumps may then be formed at selected positions on the redistribution lines, such as at an end portion of each of the redistribution lines, to correspond with another interconnect outline, such as that of a pattern of terminal pads on a circuit board or other higher-level packaging.

In one embodiment, each semiconductor die in the array may include one or more redistribution lines that may extend from the exposed end portions of the discrete conductive elements to a predetermined location on the outer surface of the filler material. The packaged die array with the mutually separate semiconductor dice therein may then be separated into multiple packages, each of which includes at least one semiconductor die therein.

In another embodiment, the packaged die array having the mutually separate semiconductor dice therein also includes redistribution lines extending between semiconductor dice. Specifically, the redistribution line interconnections may extend from a first die to a second die, from the exposed end portions of the discrete conductive elements extending from the two mutually separate semiconductor dice. In this manner, each of the mutually separate semiconductor dice in the packaged die array may be electrically interconnected to operate collectively as one package. Such electrically interconnected packaged die array may also include conductive bumps, balls, columns or pillars provided along the redistribution lines in predetermined locations so as to correspond with the interconnect outline of terminal pads of higher-level packaging, for example, of a printed circuit board.

According to yet another embodiment of the present invention, a plurality of semiconductor dice may be assembled in a stack and electrically interconnected, for example, using wire bonds, redistribution layers, edge connections and combinations thereof, the assembled and electrically interconnected semiconductor dice then being encapsulated and external electrical connections in the form of the above-referenced redistribution lines with associated conductive bumps, balls, columns or pillars fabricated as previously discussed.

According to the present invention, various types of semiconductor dice may be utilized in a single layer or stacked array, such as memory chips, flash cards and processor chips.

In another aspect of the present invention, the packaged semiconductor die or interconnected packaged semiconductor die array may be mounted to a circuit board in an electronic system, such as a computer system. In the electronic system, the circuit board is electrically interconnected to a processor device and/or an input device and an output device.

Other features and advantages of the present invention will become apparent to those of skill in the art through a consideration of the ensuing description, the accompanying drawings and the appended claims.

BRIEF DESCRIPTION OF THE SEVERAL VIEWS OF THE DRAWINGS

While the specification concludes with claims particularly pointing out and distinctly claiming that which is regarded as the present invention, the advantages of this invention may be ascertained from the following description of the invention when read in conjunction with the accompanying drawings, wherein:

DETAILED DESCRIPTION OF THE INVENTION

Figure 1:
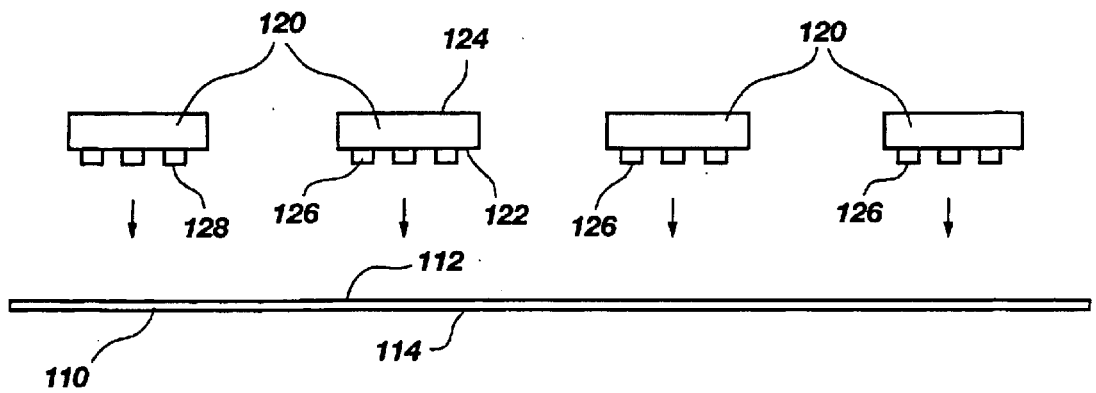
FIG. 1 illustrates a simplified side view of multiple discrete dice in preparation to be attached face down to a flexible substrate, according to the present invention.

Embodiments of the present invention will be hereinafter described with reference to the accompanying drawings. It would be understood that these illustrations are not to be taken as actual views of any specific apparatus or method of the present invention, but are merely exemplary, idealized representations employed to more clearly and fully depict the present invention than might otherwise be possible. Additionally, elements and features common between the drawing figures retain the same or similar numerical designations.

FIGS. 1–10 illustrate a process that may be used for packaging semiconductor dice according to a first embodiment of the present invention. Referring first to FIG. 1, such a process for forming the packages may be initiated with a flexible substrate 110 and multiple semiconductor dice 120. As indicated by the downward arrow, the semiconductor dice 120 are to be attached to the flexible substrate 110 in an active surface down, or facedown, arrangement.

The flexible substrate 110 includes a first surface 112 and a second surface 114. The first surface may include die attach sites 116 (illustrated in broken lines in FIG. 2) and an adhesive 113 disposed thereon for temporarily securing the semiconductor dice 120 thereto The adhesive 113 may substantially cover the entire first surface 112 or the adhesive 113 may only partially cover the first surface 112, being disposed only at the die attach sites 116 for attaching the multiple semiconductor dice 120 thereto. The flexible substrate 110 may be any suitable substrate, such as a flexible laminated polymer, a polyimide film or a polyimide tape. The adhesive may be an epoxy, acrylic, or any other suitable adhesive, which may be covered with a protective release layer until adherence of the semiconductor dice 120 thereto is required.

The semiconductor dice 120 may each include an active surface 122 and a back surface 124 with discrete conductive elements 126 extending outwardly from the active surface 122. Conductive elements 126 include a distal or end portion 128 configured for direct contact to the die attach sites 116 on the first surface 112 of the flexible substrate 110. The conductive elements 126 may be posts, pillars, studs, balls and/or bumps and may comprise any electrically conductive material, such as copper, gold, silver, aluminum, and alloys of any of the foregoing, conventional silver or tin/lead solder, or a conductive or conductor-filled polymer. As such, the active surface 122 of the semiconductor dice 120 may be attached to the flexible substrate 110 in a facedown arrangement with the conductive elements 126 disposed therebetween.

Figure 2:
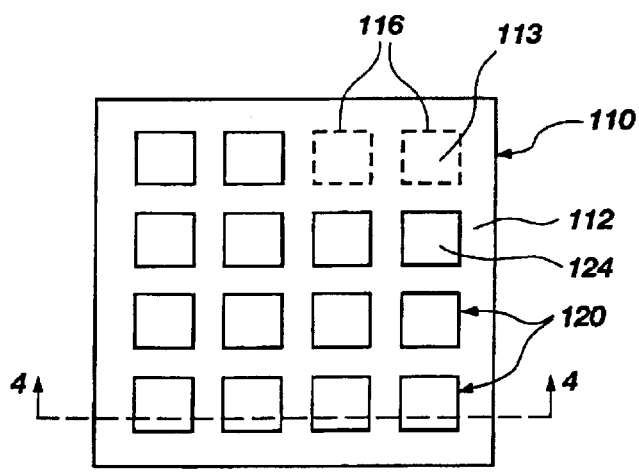
FIG. 2 illustrates a top plan view of a flexible substrate with a rectangular shape having an array of multiple discrete dice attached thereon, according to the present invention.
Figure 3:
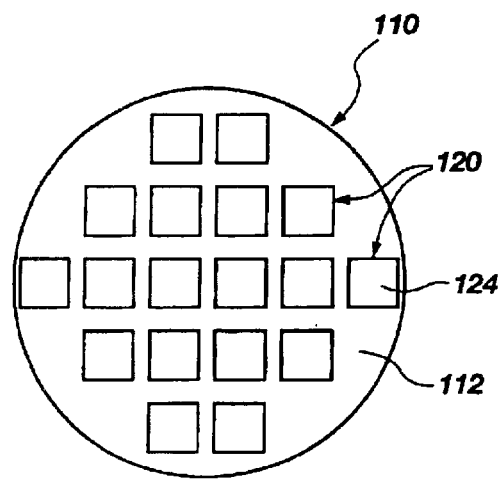
FIG. 3 illustrates a top plan view of a flexible substrate with a circular shape having an array of multiple discrete dice attached thereon, according to the present invention.

FIGS. 2 and 3 illustrate simplified top plan views of the semiconductor dice 120 attached to the first surface 112 of the flexible substrate 110. Each of the semiconductor dice 120 is attached mutually separate and discrete from each other to the flexible substrate 110. As depicted, the flexible substrate 110 may be of a rectangular shape, of a circular shape or of any suitable shape that may be required. The rectangular shape provides advantages of increased throughput due to accommodating more semiconductor dice thereon and is easily used with existing stepper equipment. The circular-shaped substrate may reduce throughput; however, the circular-shaped substrate may provide advantages of being more easily usable with existing equipment for handling and processing wafers.

Figure 4:
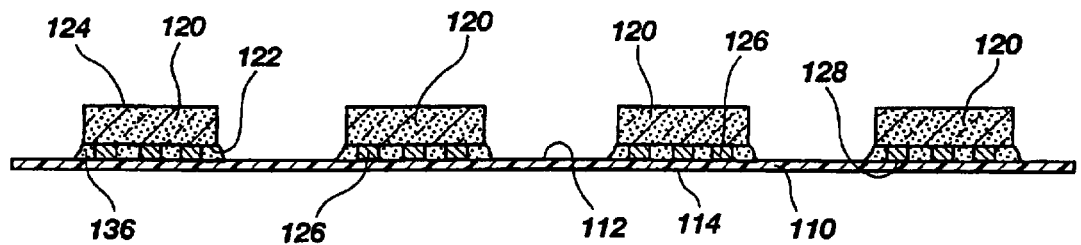
FIG. 4 illustrates a simplified cross-sectional side view taken along line 4—4 in FIG. 2, depicting the multiple discrete dice attached face down to the flexible substrate with the discrete dice underfilled with a filler material, according to the present invention.

FIG. 4 is a simplified cross-sectional side view taken along line 4—4 in FIG. 2 of the multiple semiconductor dice 120 attached to the flexible substrate 110. According to one aspect of the present invention, the end portion 128 of each of the discrete conductive elements 126 is in direct contact with the first surface 112 of the flexible substrate 110 for attachment thereto. Once the semiconductor dice 120 are adhesively attached, a dielectric filler material 136 may be optionally provided to underfill each semiconductor die 120 about each of the discrete conductive elements 126 and, further, dielectric filler material 136 may be provided between adjacent semiconductor dice 120. The dielectric filler material 136 may be a silicone gel, an epoxy, a silica-filled thermoset or thermoplastic polymer material, or any other known dielectric filler material used for underfilling semiconductor dice in a flip-chip type arrangement. Such dielectric filler material may be formulated to provide a hermetic or nonhermetic seal with the semiconductor die 120. The dielectric filler material may be provided by any known suitable means, such as by dispensing the dielectric filler material by a dispenser nozzle (not shown) at a peripheral side portion of one of the semiconductor dice 120 so that the dielectric filler material 136 underfills the semiconductor die 120 by capillary action.

Figure 5:
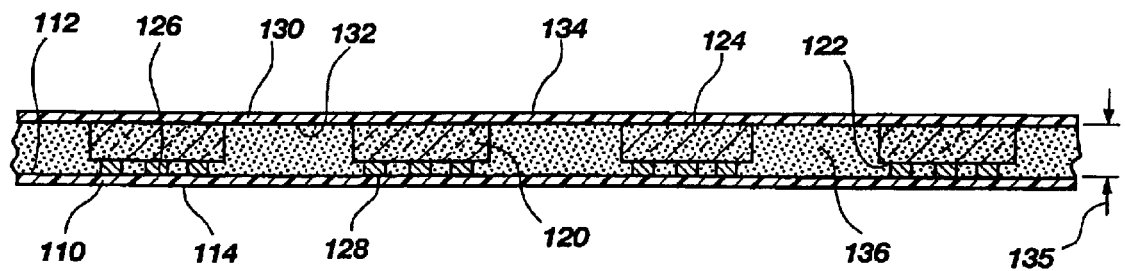
FIG. 5 illustrates a second flexible substrate disposed over the multiple discrete dice with filler material disposed between the second flexible substrate and the underlying flexible substrate to provide a packaged die array, according to the present invention.

Illustrated in FIG. 5, additional dielectric filler material 136 may be provided prior or subsequent to providing a second flexible substrate 130 to overlie the back surfaces 124 of the semiconductor dice 120. Such second flexible substrate 130 may also provide protection to the semiconductor dice 120. The second flexible substrate 130 includes a first surface 132 and a second surface 134, of which the first surface 132 may include an adhesive for attaching to the back surface 124 of each of the semiconductor dice 120. In this manner, flexible substrate 110 and second flexible substrate 130 define a gap 135 and sandwich the semiconductor dice 120 and dielectric filler material 136 therebetween.

Dielectric filler material 136 provided prior to applying the second flexible substrate 130 is applied to fill channels or gaps 135 around and between the discrete semiconductor dice 120 and between adjacent semiconductor dice 120. This channel-filling process may be effected after, or as part of, the process of underfilling the semiconductor dice 120. Dielectric filler material 136 applied subsequent to attaching the second flexible substrate 130 may also be applied to fill the gap 135. The dielectric filler material 136 may be provided to fill the gap 135 or channels by fluid or gel dispensing, pot molding, transfer molding or any suitable method known in the art.

It should be noted that, while the use of a first flexible substrate 110 maybe desirable as to facilitate proper locations of semiconductor dice 120 for encapsulation and subsequent placement of the semiconductor dice 120 as a group in a mold segment of, for example, a transfer mold, the use of first flexible substrate 110 is not a requirement of the invention. For example, the inner surface of a lower mold segment may be coated with an adhesive layer or adhesive patches may be placed at intended die attach locations. A pick and place machine may then be used to place each semiconductor die 120 at a predetermined location in the mold segment. Similarly, while a second flexible substrate 130 may be placed over the back surfaces 124 to provide protection therefor, the use thereof is also not a requirement of the present invention. In the case of transfer molding, an upper mold segment may be placed over the semiconductor dice 120 residing in the lower mold segment, the upper and lower mold segments defining a mold cavity height which approximates the height of the semiconductor dice 120 including discrete conductive elements so that the back surfaces 124 of the semiconductor dice 120 are pressed firmly against the inner surface of the upper mold segment to prevent movement of the semiconductor dice 120 when contacted by the flow front of molten encapsulant and to prevent a film or "flash" of encapsulant from being formed thereof during transfer molding. Alternatively, the semiconductor dice 120 may be adhered to an inner surface of a mold segment at desired locations with their active surfaces 122 and discrete conductive elements 126 facing upward, the upper mold segment then being placed thereover to contact the end portions 128 of the discrete conductive elements 126.

Figure 6:
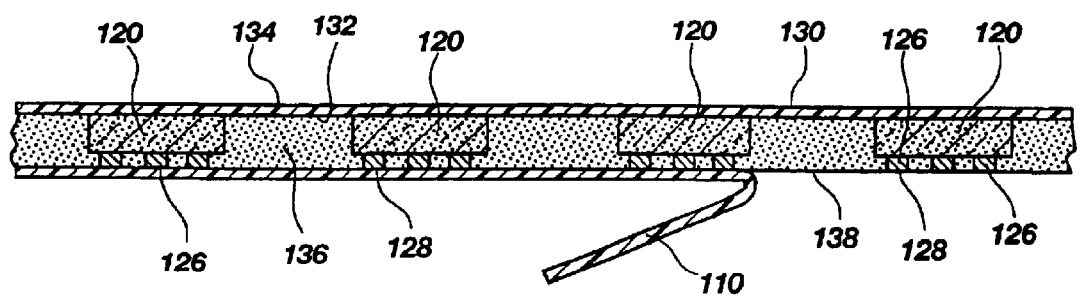
FIG. 6 illustrates the underlying flexible substrate being pulled from an outer surface of the packaged die array, according to the present invention.

Turning to FIG. 6, the underlying flexible substrate 110 (if used) may then be removed from the outer surface 138 of the dielectric filler material 136. Removing the underlying flexible substrate 110 may be accomplished manually or by machine means, or any suitable method known in the art such as by peeling, stripping, grinding or even burning the adhesive from the underlying flexible substrate 110 to allow easy removal of the flexible substrate 110. The second flexible substrate 130 (if used) may also be removed; however, it may be advantageous to maintain the attachment of the second flexible substrate 130 for enhanced protection of the semiconductor dice 120.

Figure 7:
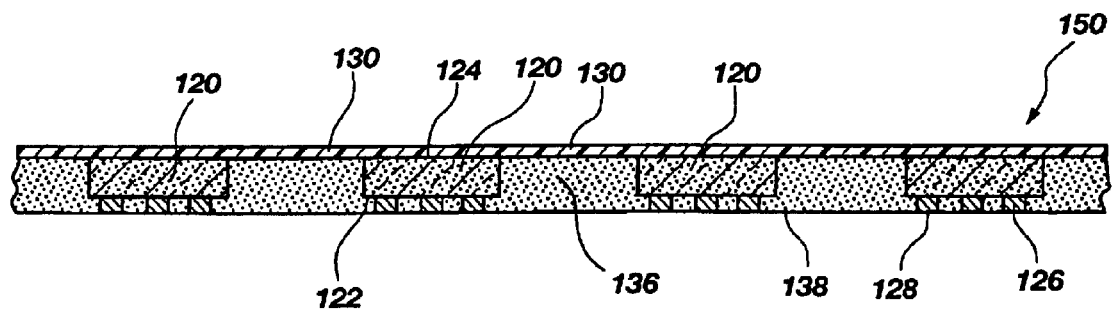
FIG. 7 illustrates the packaged die array without the underlying flexible substrate, according to the present invention.
Figure 8:
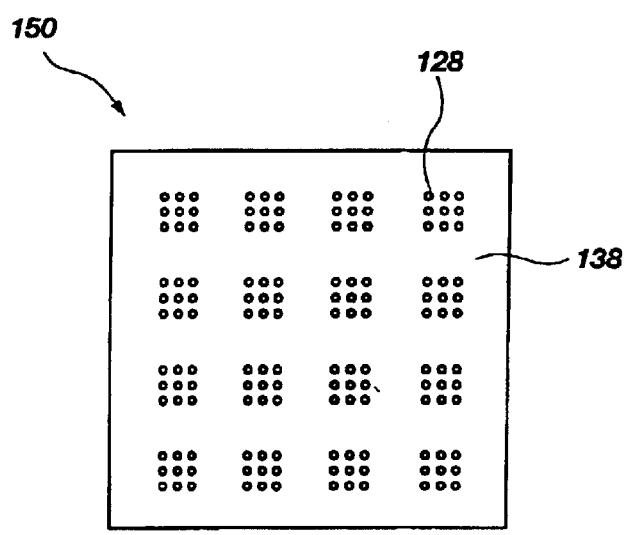
FIG. 8 illustrates a bottom plan view of the packaged die array in FIG. 7, depicting end portions of the electrical interconnects of each of the multiple discrete dice exposed on an outer surface of the packaged die array, according to the present invention.

FIG. 7 illustrates a packaged semiconductor die array 150 after removing the underlying flexible substrate 110. Such removal exposes an outer surface 138 of the dielectric filler material 136 and end portions 128 of the conductive elements 126, wherein the exposed end portions 128 are substantially flush with the outer surface 138 of the dielectric filler material 136. If required, the outer surface 138 may be planarized by grinding or abrasive polishing to ensure that each of the end portions 128 of discrete conductive elements 126 are coplanar, exposed and clean. Of course, grinding may be used to simultaneously remove flexible substrate 110 as well as planarize outer surface 138. Illustrated in FIG. 8 is a bottom plan view of the packaged semiconductor die array 150, depicting the end portions 128 of discrete conductive elements 126 exposed through the outer surface 138 of the dielectric filler material 136.

Figure 9:
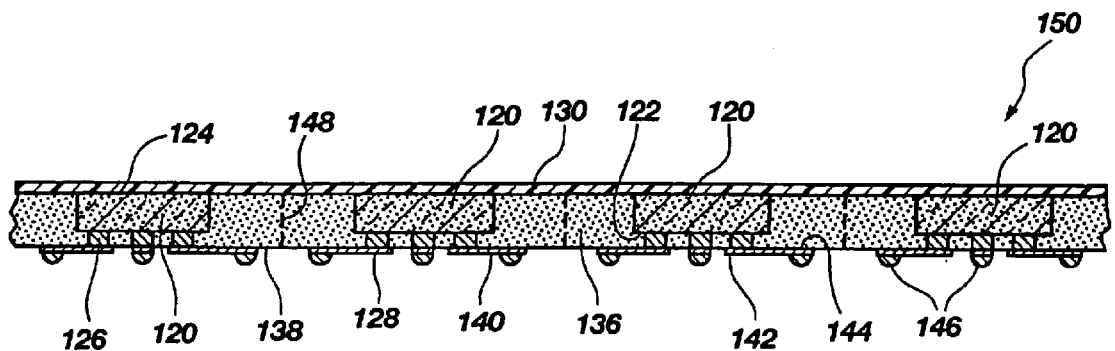
FIG. 9 illustrates a cross-sectional side view of the package in FIG. 8, depicting redistribution lines extending from the exposed end portions of the electrical interconnects to alternate locations on an outer surface of the packaged die array, according to a first embodiment the present invention.

FIG. 9 illustrates the packaged semiconductor die array 150 with structures for interconnecting to higher-level packaging formed thereon. In particular, with the end portions 128 of discrete conductive elements 126 exposed at the outer surface 138 of the dielectric filler material 136, redistribution lines 140 in the form of conductive traces may be formed on outer surface 138. According to a first embodiment of the present invention, each redistribution line 140 may extend from the exposed end portions 128 to a predetermined location on the outer surface 138 of the dielectric filler material 136 to correspond with another interconnect outline such as a pattern of terminal pads on a printed circuit board.

The redistribution lines 140 may each include a first end portion 142 and a second end portion 144 distal therefrom. The first end 142 may make electrical contact with one end portion 128 of one of the conductive elements 126, as by extending thereover in contact therewith. The second end 144 may extend to the predetermined location, which corresponds with one terminal pad of another interconnect outline. Depending on the requirements of the corresponding other interconnect outline, each of the exposed end portions 128 of the conductive elements 126 may, or may not, have a redistribution line 140 extending therefrom.

Redistribution lines 140 may be formed by depositing a redistribution layer precursor of conductive material over the outer surface 138 of the dielectric filler material 136. Such may be deposited by physical vapor deposition, chemical vapor deposition, sputtering, vacuum deposition and/or any known suitable method. Any known conductive material may be utilized as the redistribution layer precursor, such as copper or an alloy thereof. The redistribution layer precursor may then be patterned to form the redistribution lines 140 by using a wet etch or dry etch, or any known method of patterning a thin layer of conductive material. A nonconductive material (not shown), such as silicon dioxide or solder resist, may also be deposited over the redistribution lines 140 and patterned appropriately to expose only locations on which conductive bumps 146 are to be disposed or formed to prevent short circuiting.

Alternatively, the redistribution lines 140 may be preformed on a flexible dielectric tape or film carrier (formed, for example, of a polyimide such as KAPTON® having at least one preformed trace therewith, positioned over and bonded to the outer surface 138 of the dielectric filler material 136 in a process similar to tape-automated bonding (TAB) as known in the art. Redistribution lines 140 will overlie the end portions 128 of discrete conductive elements, 126 in contact therewith, which contact may be augmented by, for example, the use of a conductive or conductor-filled adhesive at the conductive element locations, thermocompression bonding of the redistribution lines 140 to the end portions 128 of discrete conductive elements 126, or otherwise as known in the art. In another approach, a laminate of a dielectric film and conductive foil perforated at the locations of discrete conductive elements 126 to enable contact of the foil with the end portions 128 may be attached to the outer surface 138 of the dielectric filler material 136 and the foil patterned and etched to form the redistribution lines 140.

Conductive bumps 146 may then be formed at selective positions on the redistribution lines 140, such as at the second end portion 144 of each of the redistribution lines 140, to correspond with another interconnect outline, such as an interconnect outline defined by terminal pads of another substrate such as a printed circuit board or another semiconductor package. Conductive bumps 146 may also be provided directly on those exposed end portions 128 that may not require a redistribution line 140 extending therefrom. Conductive bumps 146 may be formed or disposed at desired locations such as posts, pillars, columns, studs, balls and/or bumps and may be made of any electrically conductive material, such as copper, silver, gold, aluminum and alloys thereof, conventional tin/lead solder, or a conductive or conductor-filled epoxy. It is contemplated that exposed end portions 128 of discrete conductive elements 126 as well as second end portions 144 of redistribution lines 140 and the pitch or spacing therebetween should be larger than the placement variation of pick and place equipment used to position semiconductor die packages, which is on the order of ±4 μm at best. Further, it is contemplated that conductive bumps 146 be of a diameter of at least 110% of the placement variation and about two to five times larger than the width of redistribution lines 140.

Figure 10:
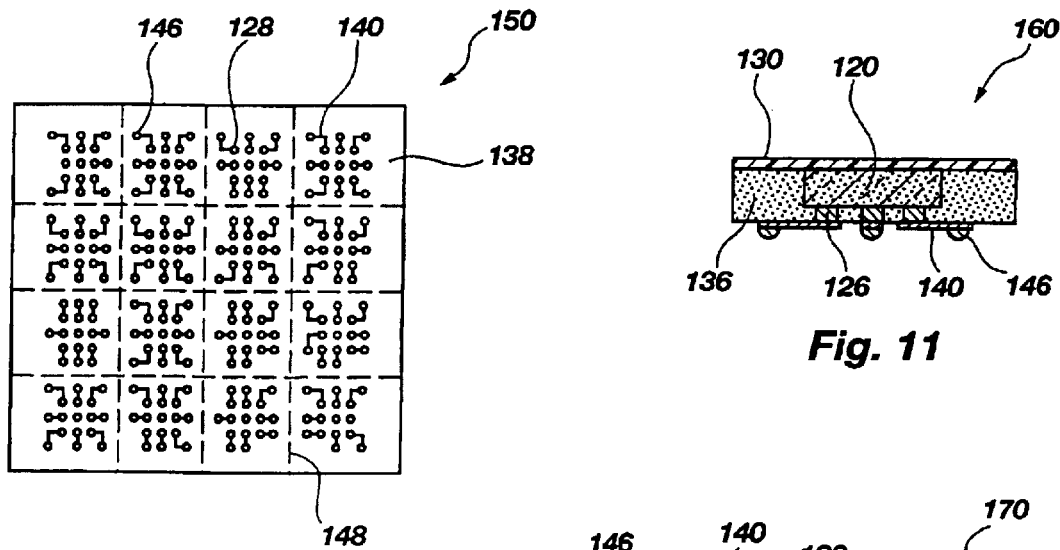
FIG. 10 illustrates a bottom plan view of the packaged die array with the redistribution lines thereof in FIG. 9, according to the first embodiment of the present invention.
Figure 11:
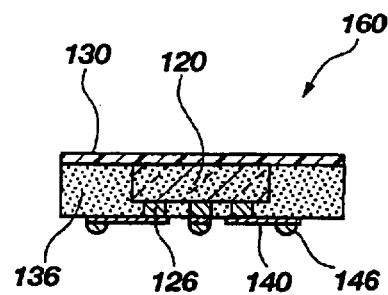
FIG. 11 illustrates a cross-sectional side view of a singulated die package, according to the first embodiment of the present invention.

FIGS. 9 and 10 illustrate the packaged dice array 150 having multiple physically interconnected packaged semiconductor dice 120, wherein each die is mutually separate from each other within the packaged dice array 150. Each packaged semiconductor die 120 is depicted in an arrangement of rows and columns separable along borders 148 as shown in broken lines. Such packaged semiconductor dice 120 may be separated by cutting along the borders 148 between the columns and rows of semiconductor dice 120 to form singulated packaged dice 160, as depicted in FIG. 11. Such cutting process may be accomplished utilizing any suitable known method such as sawing.

Figure 12:
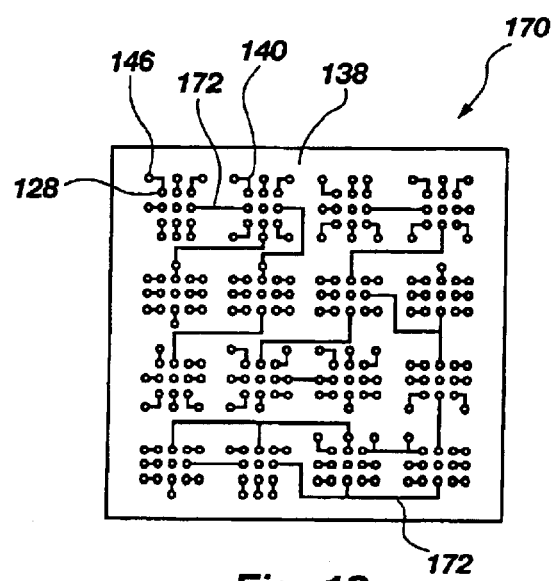
FIG. 12 illustrates a bottom plan view of the packaged die array, depicting the redistribution lines interconnecting the multiple discrete die within the packaged die array by interconnecting the exposed electrical interconnects, according to a second embodiment of the present invention.

FIG. 12 illustrates a bottom plan view of a packaged die array 170, according to a second embodiment of the present invention. The packaged die array 170 of the second embodiment is similar to the first embodiment in every respect, except for the arrangement of the redistribution lines 140. As in the first embodiment, the second embodiment includes redistribution lines 140, which extend from end portions 128 to predetermined locations with conductive bumps 146 formed thereon to correspond with another interconnect outline, such as a pattern of terminal pads on a circuit board. In addition, the second embodiment also includes redistribution line interconnections 172. Such redistribution line interconnections 172 may extend from any of the interconnections, i.e., end portion 128, redistribution line 140, or conductive bump 146, of a first die to any of the interconnections of a second die. For example, the redistribution line interconnections 172 may extend from a redistribution line 140 of a first die to another redistribution line 140 of a second die, directly from an end portion 128 of a discrete conductive element 126 of a first semiconductor die 120 to that of a second semiconductor die 120, from an end portion 128 of a discrete conductive element 126 of one semiconductor die 120 to a redistribution line 140 of another semiconductor die 120, or otherwise. Redistribution line interconnections 172 may link three, or more, semiconductor dice 120. In this manner, each of the semiconductor dice 120 in the packaged die array 170 of the second embodiment may be interconnected to operate collectively as one module, for example, as a memory module. Alternatively, some interconnected subset of the semiconductor dice 120 of packaged die array 170 may be severed from the array and employed as a module.

Figure 13:
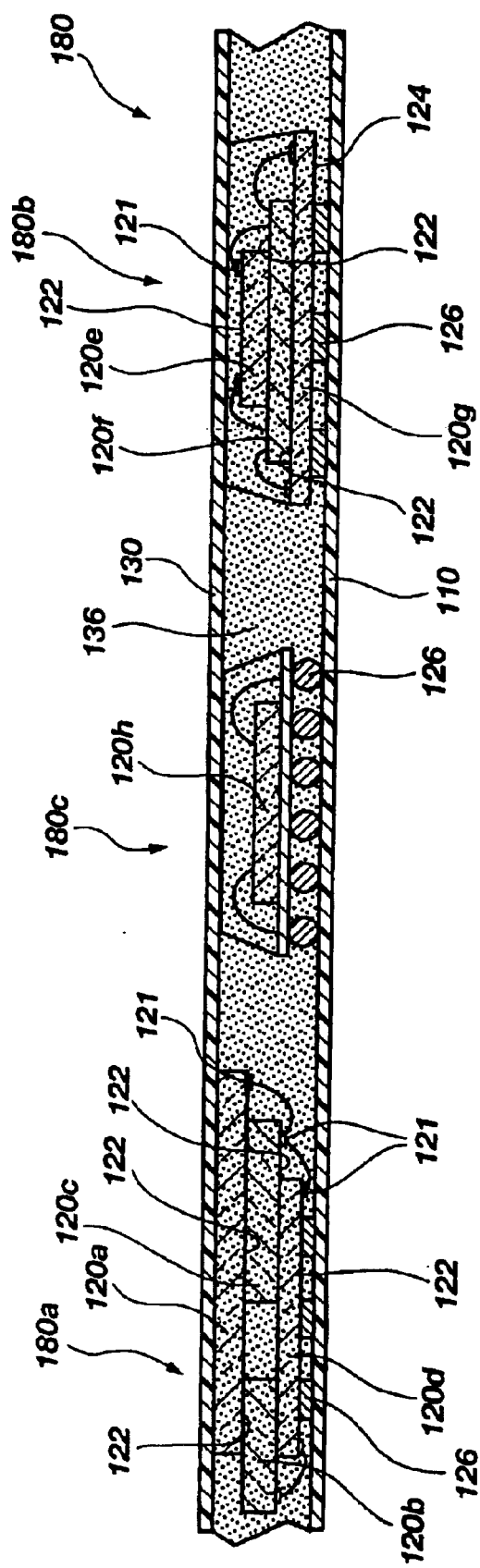
FIG. 13 illustrates various types of semiconductor assemblies and stacked dice that may he utilized in a packaged die array in either the first embodiment or the second embodiment of the present invention.

FIG. 13 illustrates a cross-sectional side view of another packaged die array 180, according to another embodiment wherein multiple semiconductor dice are stacked and interconnected at separate locations, or wherein an already at least partially packaged semiconductor die may easily have its 110 locations redistributed according to the present invention. In particular, the variant is similar to the first and second embodiments in every respect, except this variant illustrates that different types of semiconductor dice may be utilized, as may various stacked semiconductor die arrangements and redistributing of at least partially packaged semiconductor dice in packages in accordance with the present invention. As set forth previously, the flexible substrate 110 (if used) may be removed to expose end portions 128 of the discrete conductive elements 126 of the adjacent, or base, semiconductor die 120, wherein redistribution lines 140 (not shown) and/or redistribution line interconnections 172 (not shown) may extend from such exposed end portions 128 of discrete conductive element 126 and/or interconnections thereof. In this manner, it is contemplated that the packaged die array 180 may be separated into singulated semiconductor die packages in a manner similar to that of the first embodiment. Also, it is contemplated that some or each of the semiconductor die assemblies in the packaged die array 180 may be interconnected with redistribution lines 140 and redistribution line interconnections 172, as employed in the second embodiment. As such, it can be well appreciated by one of ordinary skill in the art that various types of semiconductor dice may be employed in the packaged die array 180. Such various types of semiconductor dice may be configured as memory chips, flash cards, processors or any other type of function that may be required so that the packaged dice array 180 may be interconnected and act collectively as one packaged semiconductor assembly. Alternatively, a plurality of semiconductor dice, of the same or different types, may be stacked to form a packaged stacked die array. Packaged stacked die array 180*a* employs a plurality of semiconductor dice 120*a*, 120*b* and 120*c* having bond pads 121 at a peripheral edge of each of their active surfaces 122 wire bonded to the active surface 122 of a base, flip-chip configured semiconductor die 120*d*. Packaged stacked die array 180*b* employs a plurality of semiconductor dice 120*e* and 120*f* having bond pads 121 at opposing peripheral edges of each of their active surfaces 122 wire bonded to bond pads 121 on the active surface 122 of a base semiconductor die 120*g* configured with discrete conductive elements 126 on its back surface 124. Packaged die array 180*c* employs a single, bumped and already packaged semiconductor die 120*h* wherein the discrete conductive elements 126 are being redistributed into a different outline in accordance with the present invention.

Figure 13A:
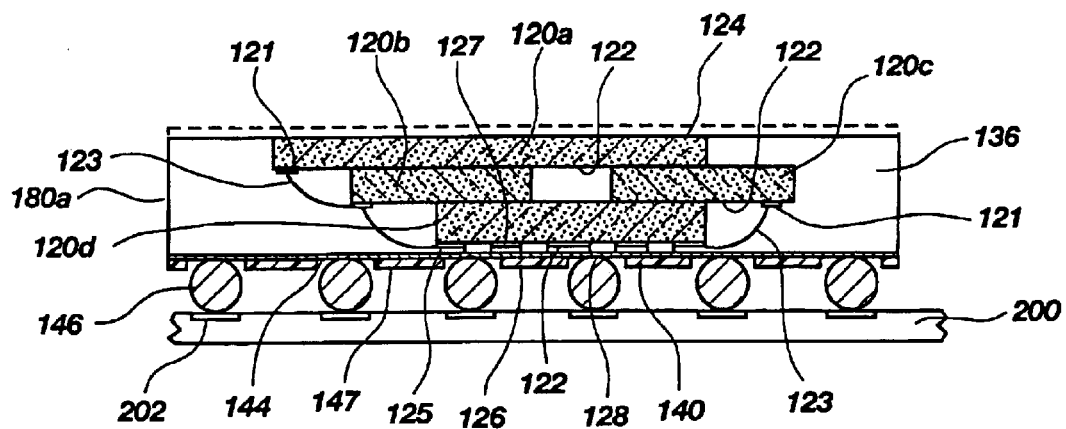
FIG. 13A is an enlarged side sectional elevation of a singulated, stacked die array according to the present invention.
Figure 13B:
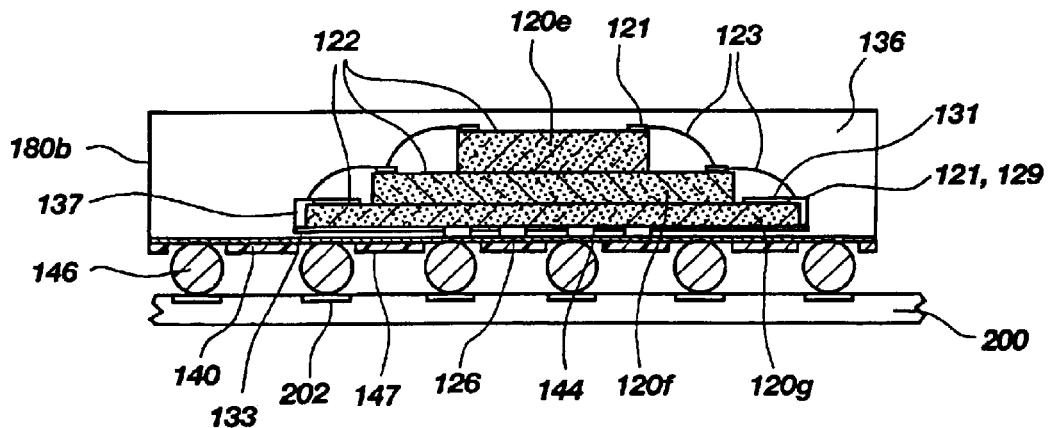
FIG. 13B is an enlarged side sectional elevation of a singulated, stacked die array according to the present invention.

FIG. 13A is an enlarged side sectional elevation of packaged stacked die array 180*a* after singulation. Semiconductor dice 120*a*, 120*b* and 120*c* each bear bond pads 121 at a peripheral edge of their respective active surfaces. As can be seen, semiconductor die 120*a* is above substantially coplanar semiconductor dice 120*b* and 120*c*. Wire bonds 123 extend between the bond pads 121 of semiconductor die 120*a* to locations on the active surface of semiconductor die 120*b*, which may comprise bond pads 121 as shown or other redistributed I/O locations. Wire bonds 123 also extend from bond pads 121 of semiconductor die 120*b* to I/O locations 125 on the active surface 122 of base, flip-chip configured semiconductor die 120*d*. I/O locations 125 communicate with discrete conductive elements 126 of base semiconductor die 120*d* using a redistribution layer 127 extending over active surface 122 of base semiconductor die 120*d*. External redistribution lines 140 comprised of conductive traces and covered, except at second end portions 144 thereof by a dielectric material 147, have conductive bumps 146 disposed or formed thereon for effecting physical and electrical connections to higher-level packaging, such as circuit board 200, in a redistributed arrangement conforming to an outline or pattern of terminal pads 202 thereof. Dielectric filler material 136 encapsulates semiconductor dice 120b, 120c and 120d, as well as wire bonds 123 and all but end portions 128 of discrete conductive elements 126. Semiconductor die 120a may have its back surface 124 exposed, as shown, for enhanced heat transfer, or may have it covered with a flexible substrate 130 or dielectric filler material 136, as shown in broken lines. It should be noted that, while wire bonds 123 are employed in packaged stacked die array 180a, it is contemplated that some or all die-to-die interconnects therein may be structured as redistribution layers on active and/or back surfaces of the semiconductor dice 120a–d connected as desired or required, by edge connects (as shown in FIG. 13B) extending over the side of one or more semiconductor dice 120a–d. Of course, the use of wire bonding may be more convenient in some instances, depending upon the stack configuration, bond pad locations, etc.

FIG. 13B is an enlarged side sectional elevation of packaged stacked die array 180b after singulation. Semiconductor dice 120e and 120f each bear bond pads 121 along opposing peripheral edges of their respective active surfaces 122. As can be seen, semiconductor die 120e is above semiconductor die 120f. Wire bonds 123 extend between the bond pads 121 of semiconductor die 120e to locations on the active surface of semiconductor die 120f, which may comprise bond pads 121 as shown or other redistributed I/O locations. Wire bonds 123 also extend from bond pads 121 of semiconductor die 120f to jumper locations 129 of a redistribution layer 131 on the active surface 122 of base semiconductor die 120g. Jumper locations 129 and the bond pads 121 of base semiconductor die 120g are electrically connected to traces of a back surface redistribution layer 133 through edge connects 137 extending over the side of base semiconductor die 120g. The traces of back surface redistribution layer 133 are, in turn, in contact with discrete conductive elements 126 of base semiconductor die 120g. External redistribution lines 140 comprised of conductive traces and covered, except at second end portions 144 thereof by a dielectric material 147 have conductive bumps 146 disposed or formed thereon for effecting physical and electrical connections to higher-level packaging, such as circuit board 200, in a redistributed arrangement conforming to an outline or pattern of terminal pads 202 thereof. Dielectric filler material 136 encapsulates semiconductor dice 120e, 120f and 120g, as well as wire bonds 123 and all but end portions 128 of discrete conductive elements 126. As with packaged stacked die array 180a, some or all die-to-die interconnects of packaged stacked die array 180b may be structured as redistribution layers on active and/or back surfaces of the semiconductor dice 120e–g connected as desired or required, by edge connects extending over the side of one or more semiconductor dice 120e–g. Of course, the use of wire bonding may be more convenient in some instances, depending upon the stack configuration, bond pad locations, etc.

Figure 13C:
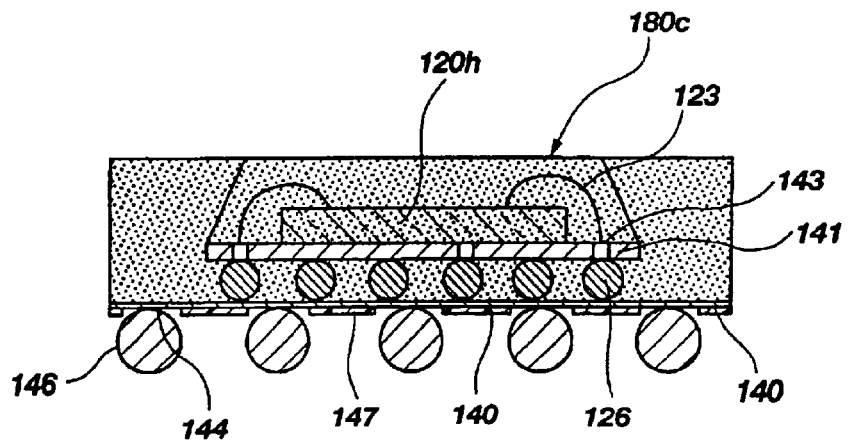
FIG. 13C is an enlarged side sectional elevation of a singulated, packaged die having a redistributed I/O pattern according to the present invention.

FIG. 13C is an enlarged, side sectional elevation of packaged die array 180c employing a single, bumped and already packaged semiconductor die 120h wherein the discrete conductive elements 126 are being redistributed into a different outline in accordance with the present invention. End portions 128 of discrete conductive elements 126 are exposed and in communication with redistribution lines 140, which are covered except at second end portions 144 with a dielectric material 147. Conductive bumps 146 are formed or disposed on second end portions 144 for effecting physical and electrical connections to higher-level packaging, such as a circuit board (not shown), in a redistributed arrangement conforming to an outline or pattern of terminal pads thereon, as in the previous cases. Thus, even an already-packaged semiconductor die may have an I/O pattern reconfigured according to the present invention. While packaged die array 180c depicts a back surface-bonded, chip-on-board assembly having discrete conductive elements 126 thereon, those of ordinary skill in the art will understand and appreciate that I/O locations on the back of board 141 extending from vias 143 may be rerouted using redistribution lines 140 over the back of board 141 and have conductive bumps 146 formed thereon. In such an instance, it maybe desirable to fabricate board 141 of a robust material which is abradable without damage, such as ceramic or even silicon, to avoid damage during planarization to exposed vias 143.

According to the present invention, an electrical interconnect outline of a flip-chip type semiconductor die, a semiconductor assembly or an already packaged die is interconnectable through redistribution lines to another interconnect outline, such as a terminal pad outline or pattern on a circuit board, without the use of a conventional interposer substrate. Such redistribution lines may also interconnect mutually separate semiconductor dice in a packaged dice array to operate collectively as one package while also interconnecting to another interconnect outline, such as a standard interconnect outline on a circuit board, without the use of an interposer substrate. Therefore, it can be well appreciated by one of ordinary skill in the art that the present invention reduces process steps in packaging semiconductor dice, provides increased reliability and eliminates the cost associated with utilizing an interposer substrate in a flip-chip type assembly or other type of semiconductor assembly.

Figure 14:
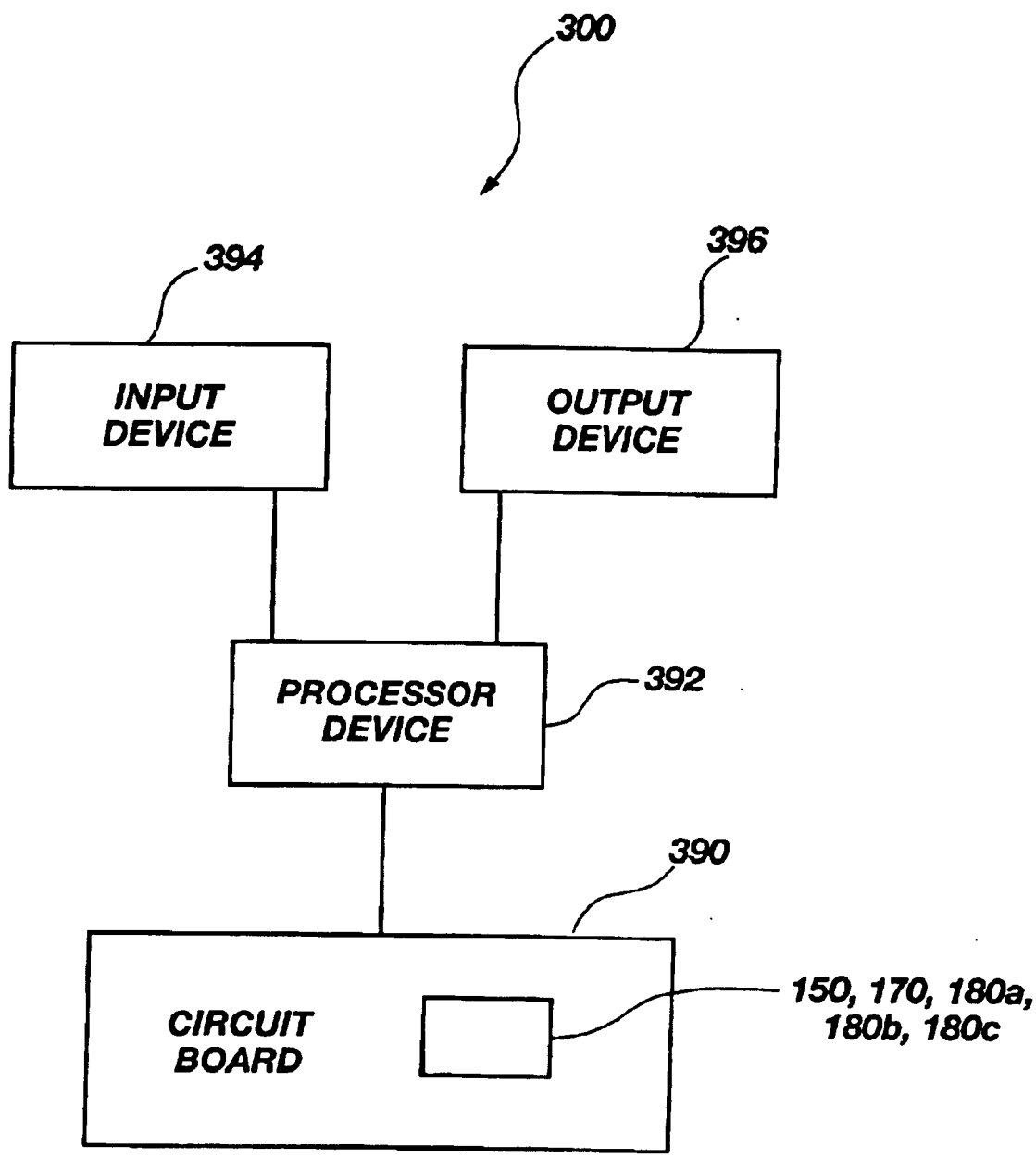
FIG. 14 illustrates a simplified block diagram of a semiconductor assembly of the present invention integrated in an electronic system.

As illustrated in block diagram form in drawing FIG. 14, singulated packaged die arrays 160, 180c and/or packaged die arrays 150, 170, 180a and 180b of the respective embodiments and variants thereof may be mounted to a circuit board 390 in an electronic system 300. In the electronic system 300, the circuit board 390 may be interconnected to a processor device 392 which communicates with an input device 394 and an output device 396. The input device 394 may be a keyboard, mouse, joystick or any other electronic system device. The output device 396 may be a monitor, printer or storage device, such as a disk drive, or any other output device. The processor device 392 may be, but is not limited to, a microprocessor or a circuit card including hardware for processing computer instructions. Additional structure for the electronic system 300 is readily apparent to those of ordinary skill in the art.

According to the present invention, an interconnect outline of a bumped semiconductor die, a semiconductor assembly or an already packaged semiconductor die is rearranged through redistribution lines to another interconnect outline or pattern, such as an interconnect outline defined by an arrangement of terminal pads on a printed circuit board, without the use of an interposer substrate. Such redistribution lines may also interconnect mutually physically separate semiconductor dice in a packaged die array to operate collectively as one package or module while also interconnecting to another interconnect outline. Modifications to and combinations of the exemplary embodiments and aspects thereof disclosed herein may be made without departing from the scope of the present invention, as defined by the claims which follow.

What is claimed is:

1. A semiconductor package comprising:
   at least one semiconductor die having an active surface and a back surface, the active surface or the back surface having discrete conductive elements extending outwardly therefrom;
   a dielectric filler material formed at least around the discrete conductive elements, the discrete conductive elements each having an end portion exposed through an outer surface of the dielectric filler material;
   at least one redistribution line comprising a conductive trace having a first surface in contact with an exposed end portion of at least one of the discrete conductive elements, the conductive trace extending over the outer surface of the dielectric filler material to a location laterally remote from the at least one of the discrete conductive elements and corresponding with a location of a terminal of an interconnect outline of another component; and
   a conductive bump disposed directly on a second, opposing surface of the conductive trace at the laterally remote location and projecting outwardly from the outer surface of the dielectric filler material.

2. The semiconductor package of claim 1, wherein the at least one semiconductor die comprises a plurality of semiconductor dice.

3. The semiconductor package of claim 2, wherein each of the plurality of semiconductor dice is mutually separate from each other with dielectric filler material disposed therebetween.

4. The semiconductor package of claim 2, wherein the plurality of semiconductor dice comprises at least one stack of semiconductor dice, at least some of which semiconductor dice are in mutual operable communication and only one of which semiconductor dice of the at least one stack includes discrete conductive elements extending, outwardly from the active surface or back surface thereof.

5. The semiconductor package of claim 3, wherein the at least one redistribution line electrically interconnects at least some of the semiconductor dice mutually separate from each other by contact with the exposed end portions of the discrete conductive elements thereof.

6. The semiconductor package of claim 4, wherein the at least one stack of semiconductor dice comprises a plurality of stacks mutually separate from each other with dielectric filler material disposed therebetween, and wherein the at least one redistribution line electrically interconnects at least some of the semiconductor die stacks by contact with the exposed end portions of the discrete conductive elements thereof.

7. The semiconductor package of claim 3, wherein the semiconductor dice mutually separate from each other comprise at least two different types of semiconductor dice.

8. The semiconductor package of claim 4, wherein the at least one stack of semiconductor dice comprises at least two different types of semiconductor dice.

9. The semiconductor package of claim 1, wherein the discrete conductive elements comprise at least one of bumps, balls, posts, studs, pillars and columns.

10. The semiconductor package of claim 1, wherein the discrete conductive elements comprise at least one of copper, gold, silver, aluminum, solder, a conductive polymer and a conductor-filled polymer.

11. The semiconductor package of claim 1, wherein the dielectric filler material comprises a material formulated to provide a seal about the at least one semiconductor die.

12. The semiconductor package of claim 1, wherein the dielectric filler material comprises a filled polymer encapsulant material at least partially encapsulating the at least one semiconductor die.

13. The semiconductor package of claim 1, wherein the conductive trace comprises an electrically conductive material extending over the outer surface of the dielectric filler material from the exposed end portion of the at least one of the discrete conductive elements to the laterally remote location.

14. The semiconductor package of claim 1, wherein the conductive trace comprises a preformed trace carried on a dielectric tape or film.

15. The semiconductor package of claim 1, wherein the at least one semiconductor die comprises a plurality of semiconductor dice in a stack, at least two of the plurality of semiconductor dice being in mutual operable communication through wire bonds extending therebetween and only one of the plurality of semiconductor dice includes discrete conductive elements extending outwardly from a surface thereof.

16. The semiconductor package of claim 15, wherein the plurality of semiconductor dice in the stack is oriented with the active surfaces thereof facing in the same direction.

17. The semiconductor package of claim 16, wherein each of the semiconductor dice of the plurality is in mutually operable communication with at least one other semiconductor die through wire bonds.

18. The semiconductor package of claim 16, wherein the plurality of semiconductor dice in the stack is encapsulated with a dielectric filler material.

19. The semiconductor package of claim 16, wherein the discrete conductive elements extend outwardly from the active surface of the only one of the plurality of semiconductor dice.

20. The semiconductor package of claim 16, wherein the discrete conductive elements extend outwardly from the back surface of the only one of the plurality of semiconductor dice.

21. The semiconductor package of claim 1, wherein the at least one semiconductor die comprises a plurality of semiconductor dice in a stack, at least two of the plurality of semiconductor dice being in mutual operable communication through redistribution lines carried on the active surface or the back surface thereof and only one of the plurality of semiconductor dice includes discrete conductive elements extending outwardly from a surface thereof.

22. The semiconductor package of claim 21, wherein at least one of the at least two of the plurality of semiconductor dice includes redistribution lines on both the active surface and the back surface thereof interconnected by edge connects extending over a side surface thereof.

23. An electronic system comprising:
   a processor device coupled to an input device and an output device; and
   a packaged semiconductor device coupled to at least one of the processor device, the input device and the output device, the packaged semiconductor device comprising:
      at least one semiconductor die having discrete conductive elements extending outwardly from an active surface or a back surface thereof;
      a dielectric filler material formed at least around the discrete conductive elements, the discrete conductive elements each having an end portion exposed through an outer surface of the dielectric filler material; and
      at least one redistribution line comprising a conductive trace having a first surface in contact with an exposed end portion of at least one of the discrete conductive elements and extending over the outer surface of the dielectric filler material to a location laterally remote from the at least one of the discrete conductive elements and corresponding with a location of a terminal of an interconnect outline of another component; and a conductive bump disposed directly on a second, opposing surface of the conductive trace at the laterally remote location and projecting outwardly from the outer surface of the dielectric filler material.

24. The system of claim 23, wherein the at least one semiconductor die comprises a plurality of semiconductor dice.

25. The system of claim 24, wherein the plurality of semiconductor dice is mutually separate from each other with dielectric filler material disposed therebetween.

26. The system of claim 24, wherein the plurality of semiconductor dice comprises at least one stack of semiconductor dice, at least some of which semiconductor dice are in mutual operable communication and only one of which semiconductor dice of the at least one stack includes discrete conductive elements extending outwardly from a surface thereof.

27. The system of claim 25, wherein the at least one redistribution line electrically interconnects at least some of the semiconductor dice mutually separate from each other by contact with the exposed end portions of the discrete conductive elements thereof.

28. The system of claim 26, wherein the at least one stack of semiconductor dice comprises a plurality of stacks mutually separate from each other with dielectric filler material disposed therebetween, and wherein the at least one redistribution line electrically interconnects at least some of the semiconductor dice stacks by contact with the exposed end portions of the discrete conductive elements thereof.

29. The system of claim 25, wherein the semiconductor dice mutually separate from each other comprise at least two different types of semiconductor dice.

30. The system of claim 26, wherein the at least one semiconductor dice stack comprises at least two different types of semiconductor dice.

31. The system of claim 23, wherein the discrete conductive elements comprise at least one of bumps, balls, posts, studs, pillars and columns.

32. The system of claim 23, wherein the discrete conductive elements comprise at least one of copper, gold, silver, aluminum, solder, a conductive polymer and a conductor-filled polymer.

33. The system of claim 23, wherein the dielectric filler material comprises a material formulated to provide a seal about the at least one semiconductor die.

34. The system of claim 23, wherein the dielectric filler material comprises a filled polymer encapsulant material at least partially encapsulating the at least one semiconductor die.

35. The system of claim 23, wherein the conductive trace comprises an electrically conductive material extending over the outer surface of the dielectric filler material from the exposed end portion of at least one of the discrete conductive elements to the laterally remote location.

36. The system of claim 23, wherein the conductive trace comprises a preformed trace carried on a dielectric tape or film.

37. The system of claim 23, wherein the at least one semiconductor die comprises a plurality of semiconductor dice in a stack, at least two of the plurality of semiconductor dice being in mutual operable communication through wire bonds extending therebetween and only one of the plurality of semiconductor dice includes discrete conductive elements extending outwardly from a surface thereof.

38. The system of claim 37, wherein the plurality of semiconductor dice in the stack is oriented with the active surfaces thereof facing in a same direction.

39. The system of claim 38, wherein each of the semiconductor dice of the plurality is in mutually operable communication with at least one other semiconductor die through wire bonds.

40. The system of claim 37, wherein the plurality of semiconductor dice in the stack are encapsulated with a dielectric filler material.

41. The system of claim 38, wherein the discrete conductive elements extend outwardly from the active surface of the only one of the plurality of semiconductor dice.

42. The system of claim 38, wherein the discrete conductive elements extend outwardly from the back surface of the only one of the plurality of semiconductor dice.

43. The system of claim 23, wherein the at least one semiconductor die comprises a plurality of semiconductor dice in a stack, at least two of the plurality of semiconductor dice being in mutual operable communication through redistribution lines carried on the active surface or the back surface thereof and only one of the plurality of semiconductor dice includes discrete conductive elements extending outwardly from a surface thereof.

44. The system of claim 43, wherein at least one of the at least two of the plurality of semiconductor dice includes redistribution lines on both the active surface and the back surface thereof interconnected by edge connects extending over a side surface thereof.

* * * * *

UNITED STATES PATENT AND TRADEMARK OFFICE
CERTIFICATE OF CORRECTION

PATENT NO. : 6,965,160 B2  
APPLICATION NO. : 10/219604  
DATED : November 15, 2005  
INVENTOR(S) : Cobbley et al.

Page 1 of 1

It is certified that error appears in the above-identified patent and that said Letters Patent is hereby corrected as shown below:

On the title page, item (57), under "Abstract", in column 2, line 7, delete "outwardly" and insert -- outward --, therefor.

In column 13, line 10, in Claim 1, delete "material;" and insert -- material, wherein the end portions of the discrete conductive elements are substantially flush with the outer surface of the dielectric filler material; --, therefor.

In column 14, lines 64–65, in Claim 23, delete "material;" and insert -- material, wherein the end portions of the discrete conductive elements are substantially flush with the outer surface of the dielectric filler material; --, therefor.

Signed and Sealed this

Eighth Day of April, 2008

JON W. DUDAS  
*Director of the United States Patent and Trademark Office*